(12) United States Patent
Fee et al.

(10) Patent No.: US 6,870,247 B2
(45) Date of Patent: Mar. 22, 2005

(54) INTERPOSER WITH A LATERAL RECESS IN A SLOT TO FACILITATE CONNECTION OF INTERMEDIATE CONDUCTIVE ELEMENTS TO BOND PADS OF A SEMICONDUCTOR DIE WITH WHICH THE INTERPOSER IS ASSEMBLED

(75) Inventors: Setho Sing Fee, Singapore (SG); Tay Wuu Yean, Singapore (SG); Lim Thiam Chye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 418 days.

(21) Appl. No.: 09/916,188

(22) Filed: Jul. 26, 2001

(65) Prior Publication Data

US 2002/0167092 A1 Nov. 14, 2002

(30) Foreign Application Priority Data

May 8, 2001 (SG) ....................................... 200102650-9

(51) Int. Cl.⁷ .............................................. H01L 23/02
(52) U.S. Cl. ........................ 257/680; 257/684; 257/687; 257/730; 257/774; 257/783; 257/784; 257/787
(58) Field of Search ................................. 257/680, 693, 257/698, 723, 724, 730, 773, 782, 678, 684, 687, 690, 692, 774, 778, 779, 780, 784, 786, 787; 438/106, 107, 109, 110, 111, 112, 118, 119, 127; 156/60; 361/600, 679, 729, 730; 174/52.1, 52.2, 52.3, 52.4

(56) References Cited

U.S. PATENT DOCUMENTS

| | | | | |
|---|---|---|---|---|
| 6,201,299 B1 | * | 3/2001 | Tao et al. | .................... 257/701 |
| 6,221,697 B1 | * | 4/2001 | Su et al. | ...................... 438/127 |
| 6,242,283 B1 | * | 6/2001 | Lo et al. | ...................... 438/106 |
| 6,252,298 B1 | * | 6/2001 | Lee et al. | .................... 257/668 |
| 6,268,650 B1 | * | 7/2001 | Kinsman et al. | ............ 257/691 |
| 6,445,077 B1 | * | 9/2002 | Choi et al. | ................... 257/786 |
| 6,472,727 B2 | * | 10/2002 | Miyazaki et al. | ........... 257/668 |
| 6,472,736 B1 | * | 10/2002 | Yeh et al. | .................... 257/686 |
| 6,525,412 B2 | * | 2/2003 | Noshita | ...................... 257/678 |
| 6,531,335 B1 | * | 3/2003 | Grigg | ......................... 438/106 |
| 2002/0020902 A1 | * | 2/2002 | Prindiville et al. | ......... 257/678 |
| 2003/0064542 A1 | * | 4/2003 | Corisis | ....................... 438/106 |
| 2003/0094681 A1 | * | 5/2003 | Noshita | ...................... 257/678 |

* cited by examiner

Primary Examiner—Alonzo Chambliss
(74) Attorney, Agent, or Firm—TraskBritt (57) ABSTRACT

An interposer including a substantially planar substrate element with a slot formed therethrough. The slot, through which bond pads of a semiconductor die are exposed upon assembly of the interposer with the semiconductor die, includes a laterally recessed area formed in only a portion of a periphery thereof. The laterally recessed area is positioned so as to expose at least a portion of an active surface of the semiconductor die located between a bond pad located adjacent an outer periphery of the semiconductor die and the outer periphery. The laterally recessed area facilitates access to the bond pad by apparatus for forming, positioning, or securing intermediate conductive elements. Semiconductor device assemblies and packages that include the interposer are also disclosed, as are methods for assembling semiconductor device components with the interposer and methods for packaging such assemblies.

18 Claims, 4 Drawing Sheets

INTERPOSER WITH A LATERAL RECESS IN A SLOT TO FACILITATE CONNECTION OF INTERMEDIATE CONDUCTIVE ELEMENTS TO BOND PADS OF A SEMICONDUCTOR DIE WITH WHICH THE INTERPOSER IS ASSEMBLED

TECHNICAL FIELD

The present invention relates generally to interposers for use in semiconductor device packages and, more specifically, to interposers that are to be assembled with semiconductor dice having bond pads arranged substantially linearly across central regions of the active surfaces thereof. In particular, the present invention relates to interposers including slots formed therethrough that are configured to facilitate the connection of bond wires to bond pads that are located proximate the edges of semiconductor dice to be assembled with the interposers. The present invention also relates to ball grid array packages including the interposers, as well as to methods for assembling the interposers with semiconductor devices and methods for forming ball grid array packages that include the interposers.

BACKGROUND ART

The dimensions of many different types of state of the art electronic devices are ever decreasing. To reduce the dimensions of electronic devices, the structures by which the microprocessors, memory devices, other semiconductor devices, and other electronic componentry of these devices are packaged and assembled with circuit boards must become more compact.

One approach to reducing the sizes of assemblies of semiconductor devices and circuit boards has been to minimize the profiles of the semiconductor devices or other electronic components upon carrier substrates (e.g., circuit boards) to which the semiconductor devices are electrically connected so as to reduce the distances the semiconductor devices protrude from the carrier substrates. Various types of packaging technologies have been developed to facilitate orientation of semiconductor devices upon carrier substrates in this manner.

One example of such a technology is the so-called "flip-chip," or controlled collapse chip connection (C-4), technology. In flip-chip technology, the bond pads or contact pads of a semiconductor device are arranged in an array over a major surface of the semiconductor device. Flip-chip techniques are applicable to both bare and packaged semiconductor devices. A packaged flip-chip type semiconductor device, which typically has a "ball grid array" (BGA) connection pattern, typically includes a semiconductor die and a substrate element, which is typically termed an "interposer." The interposer may be disposed over either the backside of the semiconductor die or the front (active) surface thereof.

When the interposer is positioned adjacent the backside of the semiconductor die, the bond pads of the semiconductor die are typically electrically connected by way of wire bonds or other intermediate conductive elements to corresponding contact areas on a top surface of the interposer. These contact areas communicate with corresponding bumped contact pads on the backside of the interposer. This type of flip-chip assembly is positioned adjacent to a carrier substrate with the backside of the interposer facing the carrier substrate.

If the interposer is positioned adjacent the active surface of the semiconductor die, the bond pads of the semiconductor die may be electrically connected to corresponding contact areas on an opposite, top surface of the interposer by way of intermediate conductive elements that extend through one or more holes formed in the interposer. Again, the contact areas communicate with corresponding bumped contact pads on the interposer. In this type of flip-chip semiconductor device assembly, however, the contact pads are also typically located on the top surface of the interposer. Accordingly, this type of flip-chip assembly is positioned adjacent a carrier substrate by orienting the interposer with the top surface thereof facing the carrier substrate.

In each of the foregoing types of flip-chip semiconductor devices, the contact pads of the interposer are disposed in an array that has a footprint that mirrors an arrangement of corresponding terminals formed on a carrier substrate. Each of the bond pads (on bare flip-chip semiconductor dice) or contact pads (on flip-chip packages) and its corresponding terminal may be electrically connected to one another by way of a conductive structure, such as a solder ball, that also spaces the interposer some distance away from the carrier substrate.

The space between the interposer and the carrier substrate may be left open or filled with a so-called "underfill" dielectric material that provides additional electrical insulation between the semiconductor device and the carrier substrate.

In addition, each of the foregoing types of flip-chip type semiconductor devices may include an encapsulant material covering portions or substantially all of the interposer and/or the semiconductor die.

Another approach to reducing the sizes of assemblies of semiconductor devices and carrier substrates has been to reduce the amount of "real estate," or surface area, upon a carrier substrate that is consumed by individual semiconductor device packages. This is typically done by reducing the dimensions of the semiconductor device packages along a plane that is parallel to a plane of the substrate upon which the semiconductor device packages are to be carried. As a result of ever-decreasing package dimensions, the so-called "chip-scale package" (CSP) has been developed. The dimensions of the outer peripheries of chip-scale packages are typically substantially the same as or only slightly larger than the corresponding dimensions of the outer peripheries of the semiconductor dice that are used in chip-scale packages.

As indicated previously herein, some chip-scale packages have ball grid array connection patterns. Some ball grid array chip-scale packages include interposers that are configured to be secured over the active surfaces of semiconductor dice, with bond pads of the dice being exposed through an opening formed through the interposer. Due to the limited dimensions of chip-scale packages, the dimensions of the interposers for use therein are also constrained, as are the sizes of openings formed through the interposers. In addition, state of the art semiconductor dice typically include bond pads that are positioned very near the outer peripheries of the dice. Consequently, in order to maintain the structural integrity of chip-scale package interposers, the interposer openings may not extend a sufficient lateral distance beyond bond pads of their corresponding semiconductor devices to provide adequate clearance for the tip of a wire bonding capillary or other intermediate conductive element-forming, -positioning, or -securing apparatus to properly access the bond pads.

Accordingly, there is a need for a chip-scale package interposer that includes an opening which is configured to facilitate access to bond pads located at or near the edges of semiconductor dice by apparatus for forming, positioning, or securing intermediate conductive elements. There is also a need for a method for fabricating such interposers.

DISCLOSURE OF INVENTION

The present invention includes an interposer with a slot formed therethrough which is configured to facilitate the connection of an intermediate conductive element, such as a bond wire, to a bond pad positioned at or very near an edge of a semiconductor die to be assembled with the interposer. Semiconductor device packages that include the interposer are also within the scope of the present invention, as are methods for assembling the interposer with a semiconductor die and for forming a package that includes the interposer.

The interposer of the present invention includes a substantially planar substrate element that may be formed from any suitable material, such as resin (e.g., FR-4 resin), plastic, insulator-coated semiconductor material (e.g., silicon oxide-coated silicon), glass, ceramic, or any other suitable electrically insulative material or insulative-coated material. The interposer also includes an opening, or slot, formed therethrough. The slot is positioned to be aligned over the bond pads of a semiconductor die upon mutual positioning of the interposer and the semiconductor die. Thus, when the interposer and semiconductor die are properly oriented, the bond pads of the semiconductor die are exposed through the slot of the interposer.

A first end of the slot is configured to extend laterally beyond an outer periphery of the semiconductor die when the interposer and semiconductor die are properly oriented with respect to one another. The opposite, second end of the slot includes a laterally recessed area along only a portion thereof. The laterally recessed area of the slot is configured to receive at least a portion of a wire bonding capillary. When the interposer is properly aligned with respect to a semiconductor die, the laterally recessed area of the slot is preferably positioned adjacent a bond pad located at or very near the edge of the semiconductor die. As a result, a wire bonding capillary or other intermediate conductive element-positioning or -forming apparatus may access the bond pad located adjacent to the laterally recessed area of the slot to form an electrical connection between that bond pad and a corresponding contact area on a surface of the interposer.

A semiconductor device package incorporating teachings of the present invention includes a semiconductor die, an interposer positioned over an active surface of the semiconductor die, wire bonds connecting bond pads of the semiconductor die to corresponding contact areas of the interposer, and a quantity of encapsulant material at least partially filling the slot formed through the interposer and at least partially covering the active surface of the semiconductor die. The encapsulant material may also extend at least partially onto the surface of the interposer and above the surface of the interposer to substantially encapsulate the bond wires that connect bond pads of the semiconductor die to corresponding contact areas of the interposer.

A method for fabricating the interposer includes providing a substantially planar substrate and forming a slot therethrough at an appropriate location. In forming the slot, a laterally recessed area is formed at an end of the slot. One example of the manner in which a slot with a laterally recessed area at an end thereof may be formed includes using a first drill bit to form a first, small hole through the substantially planar substrate element at a location where the laterally recessed area of the slot is to be positioned. The remainder of the slot is formed by using a second, larger diameter drill bit (e.g., a router bit) to form a second, larger hole proximate the location of the first, small hole and by moving the second drill bit longitudinally to elongate the second hole. Alternatively, a first drill bit may be used to form a narrow slot, then a second, larger diameter drill bit may be used to widen the slot along the length thereof except in the location where the laterally recessed area is to be located. In this case, the laterally recessed area is the remaining, narrow portion of the slot formed by the first drill bit. Thus, the first, narrower slot serves as a reference by which the second, larger drill bit that is used to form the majority of the slot is positioned.

While the foregoing exemplary methods may be used to form a slot with a laterally recessed area at a portion of an end thereof on any type of substrate element, including, without limitation, a resin, a plastic, dielectric-coated silicon (e.g., silicon oxide-coated silicon), glass, ceramic and other suitable insulative or insulator-coated substrate elements, slots having a laterally recessed area formed in only a portion of a periphery (e.g., at an end) thereof may be formed by other suitable techniques. For example, if the substrate element of the interposer is formed from silicon or another etchable material, such as glass or ceramic, known patterning processes, such as the use of known masks and etchants, which are typically used in semiconductor device fabrication processes may be employed to define a slot in the substrate element, as well as a laterally recessed area in a peripheral edge of the slot.

Other features of the interposer, such as contact areas, conductive traces, conductive vias, and terminals, may be fabricated by known circuit board or semiconductor device fabrication processes.

Other features and advantages of the present invention will become apparent to those of ordinary skill in the art through consideration of the ensuing description, the accompanying drawings, and the appended claims.

BRIEF DESCRIPTION OF DRAWINGS

In the drawings, which illustrate exemplary embodiments of the present invention:

FIGS. 6–6B are perspective views illustrating a method for forming a slot with a laterally recessed area in a peripheral edge thereof through an interposer.

BEST MODE(S) FOR CARRYING OUT THE INVENTION

Figure 1:
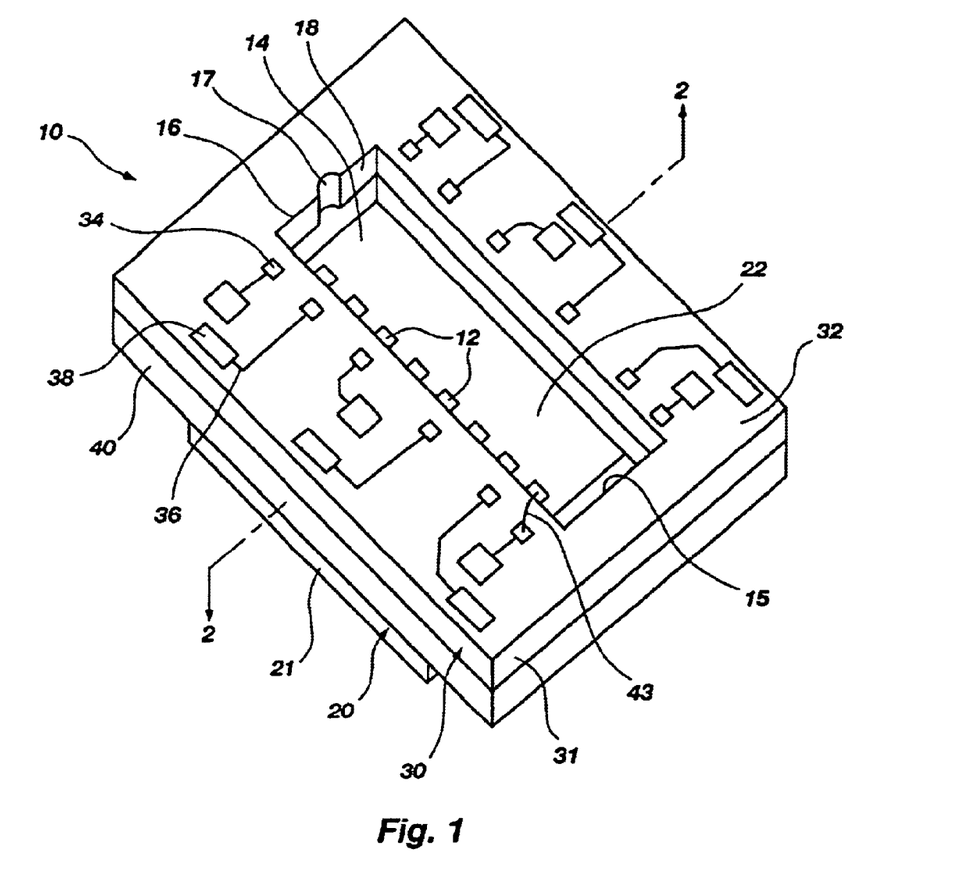
FIG. 1 is a perspective view of a semiconductor device assembly including an interposer incorporating teachings of the present invention.
Figure 2:
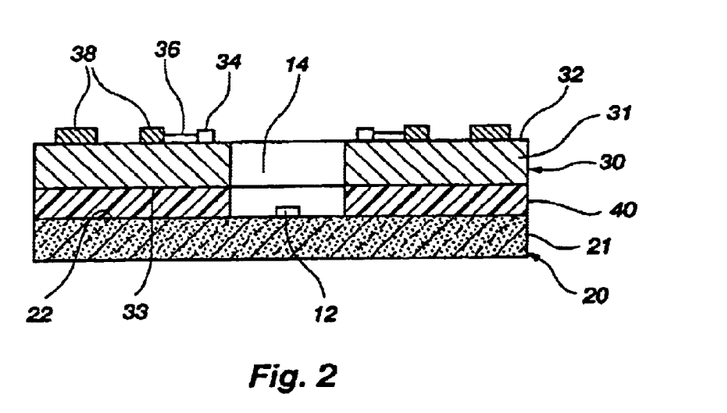
FIG. 2 is a cross-section taken along line 2—2 of FIG. 1.

Although it has many applications in semiconductor die packaging, an interposer or another substrate element of the present invention may best be described in relation to a board-on-chip assembly. A semiconductor device assembly 10 incorporating teachings of the present invention, as shown in FIGs. 1 and 2, has conductive structures 46 (shown in FIG. 5) (e.g, balls, bumps, or pillars of solder, another metal or metal alloy, or z-axis conductive elastomer) protruding therefrom in a ball grid array connection pattern and includes a semiconductor die 20 and a substrate element, which is also referred to herein as an interposer 30.

The interposer 30 includes a substantially planar substrate element 31 that may be formed from any suitable material, such as resin (e.g., FR-4 resin), plastic, insulator-coated semiconductor material (e.g., silicon oxide-coated silicon), glass, ceramic, or any other suitable, electrically insulative or at least partially dielectric-coated material, and may be positioned over the active surface 22 of the semiconductor die 20.

As shown, the interposer 30 includes an aperture, or slot 14, formed therethrough for exposing the bond pads 12 of a semiconductor device 20 over which the interposer 30 is to be positioned. The slot 14 has a first end 15 that is configured to extend laterally beyond an outer periphery 21 of the semiconductor die 20 when the interposer 30 and semiconductor die 20 are properly oriented with respect to one another. As the first end 15 of the slot 14 is configured to extend beyond the outer periphery 21 of a semiconductor die 20 to which the interposer 30 is attached, the first end 15 does not restrict the flow of encapsulant material being introduced into the slot 14 and is, therefore, also referred to herein as a "nonmold flow restriction end."

Another end 16 of the slot 14, which may be located opposite the first end 15, includes a laterally recessed area 17 in a peripheral edge 18 of the slot 14. The laterally recessed area 17 provides additional lateral access to a bond pad 12 located at or near the outer periphery 21 of the semiconductor die 20. Specifically, the laterally recessed area 17 provides additional access to bond pad 12E (see FIG. 4) that is located adjacent an outer periphery 21 of the semiconductor die 20, which is also referred to herein as an end bond pad, at a location between the bond pad 12E and the adjacent portion of the outer periphery 21 of the semiconductor die 20, than would otherwise be available with a chip-scale package interposer. As shown, the laterally recessed area 17 of slot 14 may extend beyond the outer periphery 21 of the semiconductor die 20 when the interposer 30 and the semiconductor die 20 are properly oriented with respect to one another. By providing an additional lateral opening around a portion of the end bond pad 12E, the laterally recessed area 17 may facilitate access to the end bond pad 12E by equipment that forms or positions intermediate conductive elements 43 on bond pads 12 (e.g., a portion of a wire bonding capillary).

Although the drawings illustrate an interposer 30 with only a single slot 14 formed therethrough, interposers having more than one slot formed therethrough are also within the scope of the present invention.

Contact areas 34 are carried upon a top surface 32 of the interposer 30. Preferably, the contact areas 34 are located proximate the slot 14 so as to facilitate the positioning of relatively short intermediate conductive elements 43 through the slot 14, between the bond pads 12 of a semiconductor die 20 and the contact areas 34. As illustrated in FIGS. 1 and 2, a circuit trace 36 extends laterally from each contact area 34 to a corresponding terminal 38, which may also be carried upon the top surface 32 of the interposer 30, electrically connecting each contact area 34 to its corresponding terminal 38.

To arrive at a board-on-chip configuration, such as that illustrated in FIGS. 1 and 2, a semiconductor die 20 is placed below each slot 14 in a die attach or die-receiving area of the interposer 30 so as to be positioned underneath the interposer 30 with bond pads 12 of the semiconductor die 20 being exposed through the slot 14. An active surface 22 of the semiconductor die 20 faces a backside 33 of the interposer 30 and may be secured thereto via a quantity of adhesive material 40.

When a semiconductor die 20 has been positioned adjacent the backside 33 of the interposer 30, the bond pads 12 of the semiconductor die 20 maybe electrically connected, by way of intermediate conductive elements 43 (e.g., bond wires, gold or aluminum conductors, tape automated bonding type conductors, etc.) to corresponding contact areas 34 on the top surface 32 of the interposer 30. Each of the intermediate conductive elements 43 extends through the slot 14, between a bond pad 12 of the semiconductor die 20 and its corresponding contact area 34 on the interposer 30.

Figure 5:
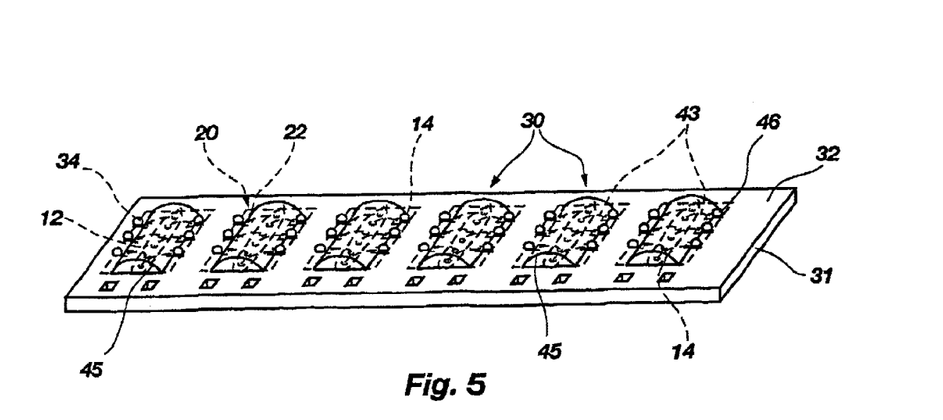

Referring now to FIG. 5, a quantity of encapsulant material 45 may partially or substantially fill the slot 14 formed through the interposer 30. The encapsulant material 45 covers at least a portion of the active surface 22 of the semiconductor die 20 and may also cover a portion of the top surface 32 of the interposer 30. Preferably, the encapsulant material 45 substantially encapsulates the intermediate conductive elements 43 that extend through the slot 14.

The slot 14 and the laterally recessed area 17 in the peripheral edge 18 of the slot 14 at an end 16 of the slot 14 may be formed through the substantially planar substrate element 31 of the interposer 30 by any known process that is suitable for forming an opening through the material of the substantially planar substrate element 31. For example, if the substantially planar substrate element 31 comprises silicon, glass, or ceramic, patterning techniques that are typically used in semiconductor device fabrication processes (e.g., mask and etch techniques) may be used to form the slot 14 and the laterally recessed area 17. When a photoimageable material is used to form the interposer 30, the slot 14 and the laterally recessed area 17 thereof may be formed through the substantially planar substrate element 31 by use of known photoimaging processes.

As another example, when the substantially planar substrate element 31 of the interposer 30 comprises a resin (e.g., FR-4 resin) or another material that has conventionally been used to form carrier substrates, the slot 14 may be formed by suitable machining processes (e.g., drilling or cutting). The laterally recessed area 17 may then be formed in a peripheral edge 18 of the slot 14.

Figures 6, 6A:
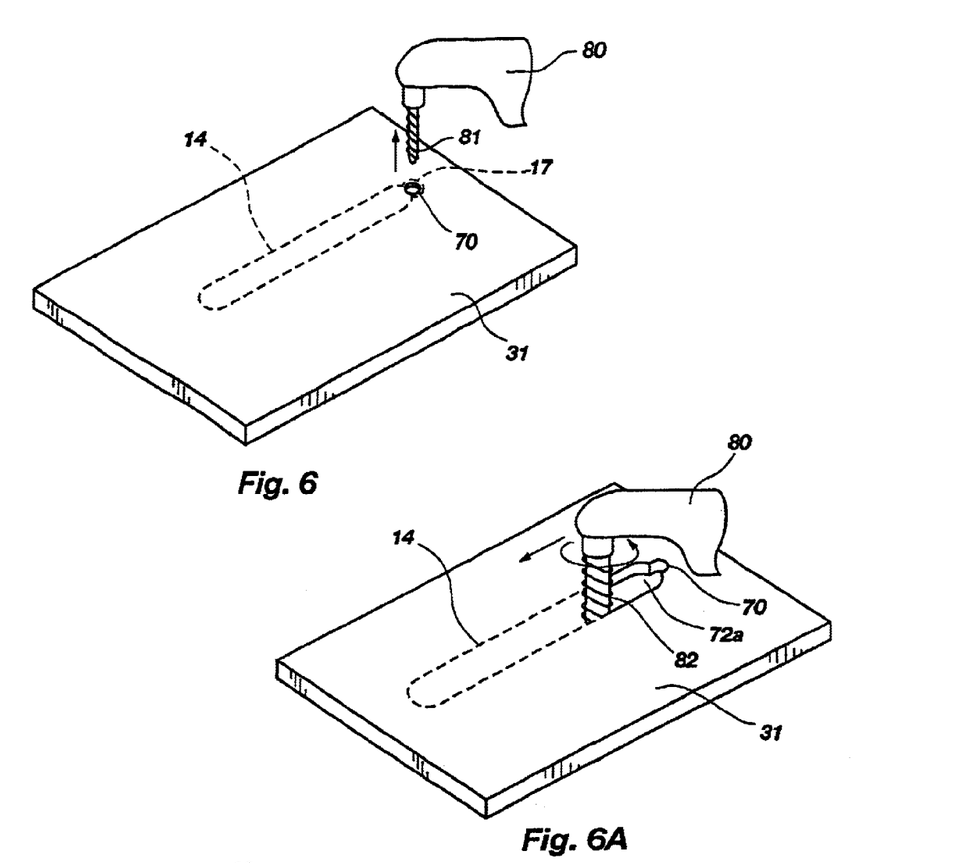
Figure 6B:
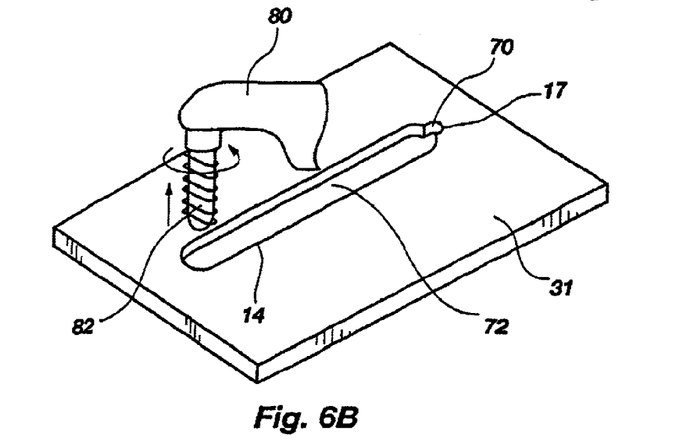

Turning now to FIGS. 6–6B, the slot 14 and the laterally recessed area 17 thereof may be formed through the substantially planar substrate element 31 by drilling.

As shown in FIG. 6, a first, small hole 70 may be formed through the substantially planar substrate element 31 at a location thereof where the formation of a laterally recessed area 17 is desired. By way of example, the first, small hole 70 may be formed by use of a drill 80 and a first drill bit 81.

FIGS. 6A and 6B illustrate the formation of a second, wider, elongated hole 72 through the substantially planar substrate element 31 at a location where the formation of a slot 14 is desired, which location is adjacent and continuous with the first, small hole 70. The second hole 72 may be formed by use of the drill 80 and a second drill bit 82, which has a larger diameter than that of the first drill bit 81. As depicted in FIG. 6A, the second drill bit 82 may be used to form a hole 72a at a location adjacent and continuous with the location of the first, small hole 70. The length of the hole 72a may then be extended to form the remainder of the second hole 72 by moving the second drill bit 82 in a direction parallel to the plane of the substantially planar substrate element 31 while the second drill bit 82 is being rotated and intersects the plane of the substantially planar substrate element 31, as shown in FIG. 6B.

Figure 7:
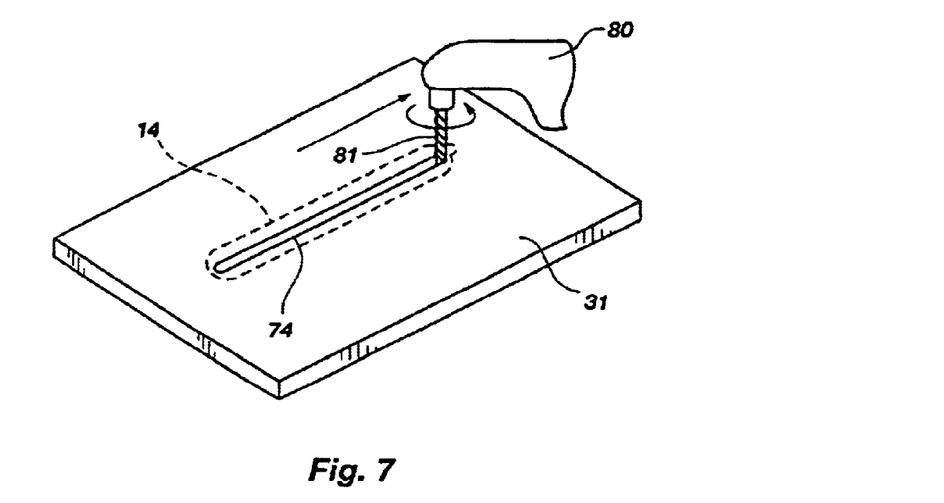
FIGS. 7 and 7A are perspective views that depict another method for forming a slot with a laterally recessed area in a peripheral edge thereof through an interposer.
Figure 7A:
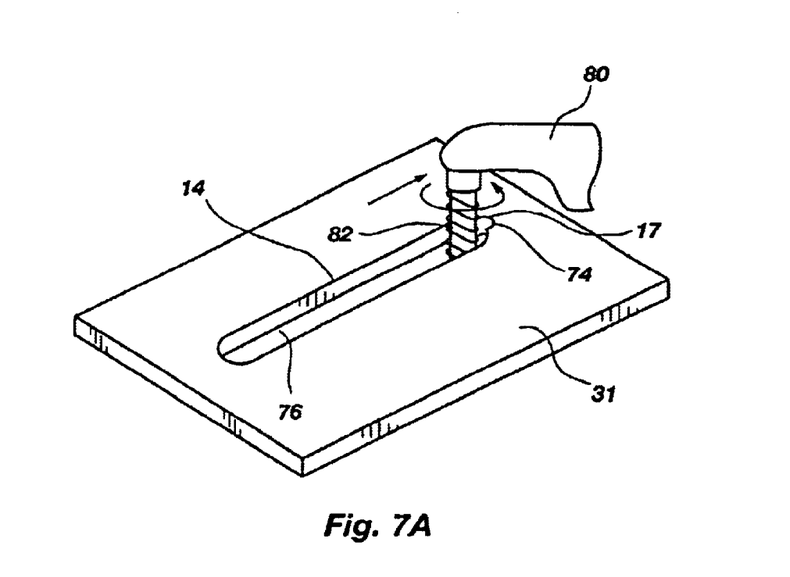

Alternatively, with reference to FIGs. 7 and 7A, the slot 14 and the laterally recessed area 17 thereof may be formed by using a drill 80 and a first drill bit 81 to form a first, small hole 74 through the substantially planar substrate element 31 at areas thereof where the slot 14 and the laterally recessed area 17 are to be located. As shown in FIG. 7, the first, small hole 74 may be formed by allowing the first drill bit 81 to penetrate the substantially planar substrate element 31 and, while the first drill bit 81 is being rotated and continues to intersect the plane of the substantially planar substrate element 31, by moving the first drill bit 81 in a direction parallel to the plane of the substantially planar substrate element 31.

FIG. 7A depicts the introduction of a second drill bit 82 into the first, small hole 74. The second drill bit 82 has a larger diameter than that of the first drill bit 81 (FIG. 7). The first, small hole 74 serves as a guide to the second drill bit 82 as the second drill bit 82 is moved along the first, small hole 74 in a direction parallel to the plane of the substantially planar substrate element 31 to increase the thickness of the first small hole 74 and to form a second, wider hole 76 at locations where the slot 14 is to be located. Stated another way, the second drill bit 82 is used to form the second hole by increasing the width of the first, small hole 74 at all locations along the length thereof except for that at which the laterally recessed area 17 is to be located. The laterally recessed area 17 is formed by the remaining, original width portion of the first, small hole 74.

Figure 3:
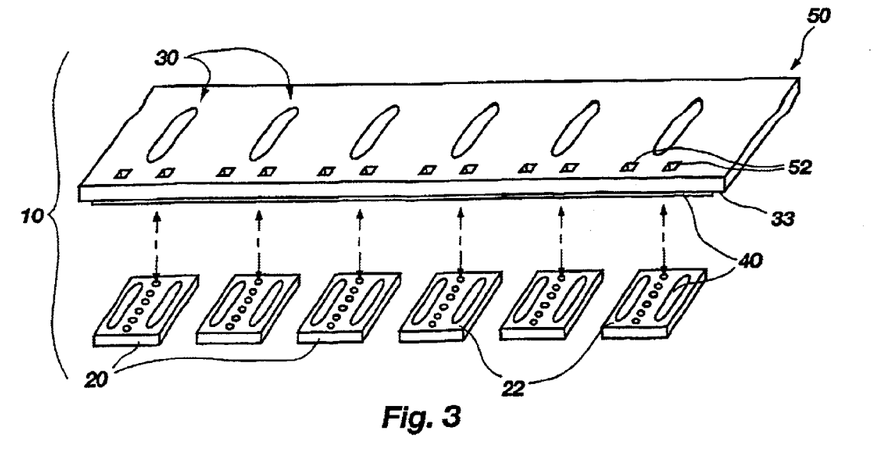
FIGS. 3–5 schematically illustrate assembly and packaging processes in which the inventive interposer is used.
Figure 4:
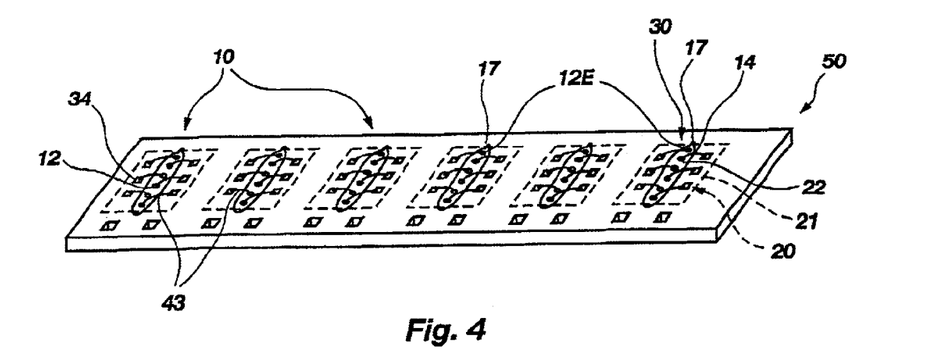

Turning now to FIGS. 3–5, methods for assembling the interposer 30 with a semiconductor device 20 and for packaging a semiconductor device 20 are depicted.

As shown in FIG. 3, a plurality of interposers 30 may be provided in the form of a strip 50 that includes a plurality of interposers 30 that are physically connected in an end-to-end fashion. The strip 50 or each interposer 30 thereon may also be configured with guide holes 52 for handling and positioning each interposer 30 during automated assembly and packaging processes.

In forming semiconductor device assemblies 10, a quantity of a suitable adhesive material 40 is applied to at least portions of one or both of the backside 33 of each interposer 30 and the active surface 22 of each semiconductor die 20. Known processes, including, without limitation, spray coating, curtain coating, use of a doctor blade, or positioning of a film or tape bearing adhesive material 40 on both major surfaces thereof, may be used to apply the adhesive material 40 to the backside 33 of the interposer 30, to the active surface 22 of the semiconductor die 20, or to both backside 33 and active surface 22. The adhesive material 40 is preferably positioned such that it will not cover the bond pads 12 of a semiconductor die 20 once the interposer 30 and semiconductor die 20 are assembled.

With reference to FIG. 4, a semiconductor die 20 may then be positioned relative to and secured to each interposer 30 on the strip 50 to form semiconductor device assemblies 10 that are physically connected to one another by way of the material that physically connects adjacent interposers 30 along the strip 50. When each semiconductor die 20 is properly positioned relative to an interposer 30 on the strip 50, the bond pads 12 of the semiconductor die 20 will be exposed through both the adhesive material 40 (FIG. 3) and the slot 14 formed through the interposer 30. The laterally recessed area 17 of the slot 14 of each interposer 30 is positioned laterally adjacent to a bond pad 12E that is located adjacent an outer periphery 21 of the semiconductor die 20.

Once a semiconductor die 20 has been properly positioned relative to and secured to each of the interposers 30 on the strip 50, each bond pad 12 of each semiconductor die 20 may be electrically connected to its corresponding contact area 34 on the interposer 30 by forming or placing an intermediate conductive element 43 between the bond pad 12 and the contact area 34. Known processes and equipment, such as wire bonding processes and apparatus, may be used to form or place intermediate conductive elements 43 between each bond pad 12 and its corresponding contact area 34. The laterally recessed area 17 of the slot 14 formed through each interposer 30 facilitates access by such equipment to the end bond pad 12E so that an intermediate conductive element 43 may be more easily positioned between that bond pad 12E and its corresponding contact area 34 on the interposer 30.

Turning now to FIG. 5, at least a portion of the active surface 22 of each semiconductor die 20 may also be encapsulated, as known in the art, by introducing a quantity of a suitable encapsulant material 45 (e.g., a filled polymer transfer molding compound or a silicone or epoxy glob-top type encapsulant material) into the slot 14. The encapsulant material 45 preferably covers at least portions of the active surface 22 of the semiconductor die 20, including the bond pads 12 thereon. The encapsulant material 45 may also substantially cover the intermediate conductive elements 43 that extend between the bond pads 12 of each semiconductor die 20 and the corresponding contact areas 34 of the interposer 30. Accordingly, the encapsulant material 45 may substantially fill the slot 14 and cover the regions of the top surface 32 of the interposer 30 at which the contact areas 34 are located.

Once the encapsulant material 45 has been introduced into the slot 14, it is permitted to harden, set, or cure. For example, if a thermoplastic resin is used as the encapsulant material 45, the encapsulant material will harden upon cooling of the same. If a transfer molding compound or other thermosetting resin is used as the encapsulant material 45, the encapsulant material 45 may be cured by applying heat and/or pressure to the same. If the encapsulant material 45 is a photoimageable polymer, the encapsulant material 45 may be set or cured by exposing the same to an appropriate wavelength of radiation.

Conductive structures 46, such as balls, bumps, or pillars formed from a conductive material, such as solder, another metal or metal alloy, or z-axis conductive elastomer, may be secured to terminals 38 (FIGS. 1–2) of the interposer 30 to facilitate the connection of semiconductor device assembly 10 to a carrier substrate or to another assembly, such as in a multi-chip module (MCM) configuration, as known in the art.

Adjacent semiconductor device assemblies 10 may be separated from one another by use of known processes, such as by saw-cutting or use of an energy beam (e.g., a laser or ion beam) to cut the strip 50 at locations between adjacent interposers 30.

Of course, semiconductor device assemblies 10 may also be formed separately from one another by securing an individual interposer 30 and semiconductor die 20 to one another, as described previously herein with respect to FIG. 3, and electrically connecting the bond pads 12 of the semiconductor die 20 to corresponding contact areas 34 of the interposer 30.

As another alternative, semiconductor device assemblies 10 may be formed on a larger scale, such as a wafer scale, wherein an array of physically connected interposers 30 is provided (e.g., on a wafer or other large-scale substrate) and semiconductor dice 20, which may be separate from one another or also physically connected to one another on a large-scale substrate, are aligned with and secured to the interposers 30.

Although the interposer 30 has been described herein in terms of a circuit board-type interposer and the method of the present invention is described in terms of assembling one or more semiconductor dice with a circuit board-type interposer, other types of substrates (e.g., other carrier substrates) that incorporate teachings of the present invention, as well as assemblies and packages including such substrate elements and assemblies, methods relating to the fabrication of such substrate elements, and assembly and packaging methods that include use of such substrate elements are also within the scope of the present invention.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. An interposer, comprising:
    a substrate element; and
    a slot formed through said substrate element, said slot including a first end configured to extend beyond an outer periphery of a semiconductor die upon assembly of the interposer with the semiconductor die and a second end including a laterally recessed area formed in only a portion thereof, wherein said laterally recessed area is positioned for alignment laterally adjacent to a bond pad of the semiconductor die upon positioning the interposer over the semiconductor die, so as to be located laterally over a portion of an active surface of the semiconductor die located between the bond pad and an outer periphery of the semiconductor die.

2. The interposer of claim 1, wherein said substrate element comprises at least one of a resin, a plastic, silicon, an insulator-coated semiconductor, an insulator-coated material, and an electrically insulative material.

3. The interposer of claim 1, wherein said laterally recessed area is configured to receive at least a tip of a wire bonding capillary.

4. The interposer of claim 1, wherein said laterally recessed area is configured to facilitate access to the bond pad of the semiconductor die by equipment for forming, positioning, or securing intermediate conductive elements.

5. A semiconductor device assembly, comprising:
    a semiconductor die with a plurality of bond pads on an active surface thereof, at least one bond pad of said plurality of bond pads being located adjacent an outer periphery of said semiconductor die; and
    an interposer positionable over said semiconductor die, said interposer including at least one elongate slot formed therethrough, said at least one elongate slot including an end with a laterally recessed area formed in a portion thereof, said laterally recessed area, upon positioning said interposer over said semiconductor die, exposing said at least one bond pad and at least a portion of said active surface located between said at least one bond pad and said outer periphery of said semiconductor die.

6. The semiconductor device assembly of claim 5, wherein said plurality of bond pads of said semiconductor die is arranged substantially linearly across a central region of said active surface.

7. The semiconductor device assembly of claim 5, wherein said laterally recessed area is configured to receive at least a portion of apparatus for forming, positioning, or securing an intermediate conductive element.

8. The semiconductor device assembly of claim 5, wherein said laterally recessed area is configured to receive at least a tip of a wire bonding capillary so as to facilitate electrical connection of said at least one bond pad to a corresponding contact pad on a surface of said interposer.

9. The semiconductor device assembly of claim 5, further comprising an intermediate conductive element extending between said at least one bond pad and a corresponding contact area on said interposer.

10. The semiconductor device assembly of claim 5, wherein said interposer is part of a strip comprising a plurality of physically connected interposers, each interposer of said plurality being configured for assembly with a corresponding semiconductor die.

11. An interposer, comprising:
    a substrate element; and
    a slot formed through said substrate element, said slot including a first end configured to extend beyond an outer periphery of a semiconductor die upon assembly of the interposer with the semiconductor die and a second end including a laterally recessed area formed in only a portion thereof and configured to facilitate access to a bond pad of the semiconductor die by equipment for forming, positioning, or securing an intermediate conductive element such that an end of the intermediate conductive element is secured to or located adjacent to the bond pad.

12. The interposer of claim 11, wherein said substrate element comprises at least one of a resin, a plastic, silicon, an insulator-coated semiconductor, an insulator-coated material, and an electrically insulative material.

13. The interposer of claim 11, wherein said laterally recessed area is configured to receive at least a tip of a wire bonding capillary.

14. The interposer of claim 11, wherein said laterally recessed area is positioned for alignment laterally adjacent to the bond pad of the semiconductor die upon positioning the interposer over the semiconductor die, so as to be located laterally over a portion of an active surface of the semiconductor die located between the bond pad and an outer periphery of the semiconductor die.

15. A semiconductor device assembly, comprising:
    a semiconductor die with a plurality of bond pads on an active surface thereof, at least one bond pad of said plurality of bond pads being located adjacent an outer periphery of said semiconductor die; and
    an interposer positionable over said semiconductor die, said interposer including at least one elongate slot formed therethrough, said at least one elongate slot including an end with a laterally recessed area formed in a portion thereof, said laterally recessed area:
        upon positioning said interposer over said semiconductor die, exposing said at least one bond pad and at least a portion of said active surface located between said at least one bond pad and said outer periphery of said semiconductor die; and configured to receive at least a portion of apparatus for forming, positioning, or securing an intermediate conductive element.

16. The semiconductor device assembly of claim 15, wherein said plurality of bond pads of said semiconductor die is arranged substantially linearly across a central region of said active surface.

17. The semiconductor device assembly of claim 15, further comprising an intermediate conductive element extending between said at least one bond pad and a corresponding contact area on said interposer.

18. The semiconductor device assembly of claim 15, wherein said interposer is part of a strip comprising a plurality of physically connected interposers, each interposer of said plurality being configured for assembly with a corresponding semiconductor die.

* * * * *